United States Patent [19]

Joy et al.

[11] 4,387,336
[45] Jun. 7, 1983

[54] METHOD AND APPARATUS FOR CABLE CONDUCTOR SHIELD FAULT DETECTION

[75] Inventors: Edward B. Joy, Stone Mountain; Athanasios P. Meliopoulos, Decatur; Roger P. Webb, Marietta, all of Ga.

[73] Assignee: Southwire Company, Carrollton, Ga.

[21] Appl. No.: 120,816

[22] Filed: Feb. 12, 1980

[51] Int. Cl.³ .................... G01R 31/02; G01R 31/12; B29F 3/10

[52] U.S. Cl. .................................. 324/51; 264/40.2; 324/54; 425/169

[58] Field of Search ........................... 324/52, 51, 54; 264/40.2; 425/169

[56] References Cited

U.S. PATENT DOCUMENTS

| | | | |
|---|---|---|---|
| 1,943,392 | 1/1934 | Paine et al. | 324/54 |
| 2,087,783 | 7/1937 | Savage | 324/54 |
| 2,329,098 | 9/1943 | Browning et al. | 324/54 |
| 2,704,825 | 3/1955 | Martin et al. | 324/54 |
| 2,794,169 | 5/1957 | Gooding | 324/54 |
| 2,882,491 | 4/1959 | Gooding | 324/54 |
| 2,894,204 | 7/1959 | Gambrill | 324/54 |
| 3,015,774 | 1/1962 | Eigen | 324/54 |
| 3,096,478 | 7/1963 | Brown | 324/54 |
| 3,241,061 | 3/1966 | Quittner | 324/61 R |
| 3,346,808 | 10/1967 | Bader | 324/54 |
| 3,466,537 | 9/1969 | Eigen | 324/54 |
| 3,612,994 | 10/1971 | Hooper | 324/54 |
| 3,841,810 | 10/1974 | Robinson et al. | 324/54 X |
| 3,988,666 | 10/1976 | Rowland et al. | 324/54 |
| 4,260,566 | 4/1981 | Brouwer et al. | 324/54 X |

Primary Examiner—Gerard R. Strecker
Attorney, Agent, or Firm—Herbert M. Hanegan; Stanley L. Tate; R. Steven Linne

[57] ABSTRACT

Disclosed is an apparatus and method for continuously detecting skips, protrusions, protuberances and other defects in cable conductor shield, comprising a high voltage electrode, a capacitance bridge filter circuit and a corona discharge detector. A noncontacting coaxial electrode is employed to create an electric field between the cable conductor and the electrode. In the presence of this field, defects in the shield produce corona discharges. A detection circuit employing a capacitance bridge is employed to continuously detect corona discharges and produce signals used for subsequently locating the positions of the defects on the finished cable.

19 Claims, 7 Drawing Figures

METHOD AND APPARATUS FOR CABLE CONDUCTOR SHIELD FAULT DETECTION

BACKGROUND OF THE INVENTION

The present invention relates generally to the manufacture of high voltage cable of the type comprising a central conductor covered by a conductor shield, insulation and an insulation shield; and specifically to an apparatus for and method of continuously detecting skips, protrusions, protuberances and other defects in cable conductor shield.

Conductor shield is employed to provide a uniform electric field at the interface between the cable conductor and insulation. Points of discontinuity in the conductor shield, such as voids or protuberances in the shield become points of high voltage stress on the insulator, leading to untimely cable failure. Furthermore, the degree of stress resulting from a conductor shield discontinuity is largely determined by the geometry of the discontinuity. A small, very pointed protuberance in the conductor shield will be more deleterious to cable performance than will a relatively larger rounded protuberance.

To prevent premature cable failure, detection of skips, protrusions, protuberances and other defects in the shielding of cable conductors during cable manufacture is necessary.

Widespread underground use of high voltage cable of the type comprising a central shielded conductor, insulation and insulation shield began in the 1960's. In the early 1970's these cables began to fail. A major cause of failure was the phenomenon known as electrochemical treeing, and investigation has shown that conductor shield defects are the source of a substantial number of electrochemical trees. Since that time the cable industry has searched for methods of reducing cable failures by identifying and reducing conductor shield defects.

U.S. Pat. No. 3,841,810, discloses one of first attempts to detect conductor shield imperfections, namely, a contact system which measures resistance between the conductor and a portion of the insulation extruder. Several major problems are inherent in that system. For example, the system cannot determine the severity of defects, that is, it cannot distinguish between harmless gradual circumferential changes and sudden changes which are harmful. Since it is a contact system, the component contacting the conductor shield must be changed each time the conductor dimension changes. In addition, the system is easily fouled by contaminants such as die bleed accumulations which cannot pass through the detection component.

In April 1979, during the SEVENTH IEEE POWER ENGINEERING SOCIETY TRANSMISSION AND DISTRIBUTION CONFERENCE AND EXPOSITION, Phelps Dodge Co. reported on its efforts in the field. The Phelps Dodge process includes a protrusion limiter which electronically examines the extrusion compound for metal particles and rejects any contaminated pellets before they reach the extruder. An optical skip detector comprising numerous optical sensors detects skips by recognizing change in reflected light. This method is inefficient because examination of the extrusion compound can be performed much more easily and less expensively by a sample method and because an optical skip detector is limited to detection of apparent defects and cannot detect hidden defects.

Other methods for detecting conductor shield defects prior to the development of this invention include post-manufacture corona tests on finished cable and capacitance tests on the conductor prior to application of the insulation shielding.

SUMMARY OF THE INVENTION

The present invention is a continuous corona current measurement-type skip and protrusion detector for high voltage cable comprising a high voltage 60 HZ power supply, a non-contacting high voltage electrode, a capacitance bridge filter circuit and a corona discharge detector for detecting skips, tears, protuberances and other defects in the semi-conducting material comprising the conductor shield of high voltage electrical cable during manufacture. By passing the cable, with conductor shield applied and prior to application of insulation, through a noncontacting electrode maintained at constant potential relative to the conductor, the conductor shield is subjected to an electric field. Voids and protuberances in the conductor shield in the presence of this field become points of high voltage stress, resulting in corona discharge at such points. The apparatus of the present invention detects the incidence of such discharge by employing a capacitance bridge circuit and appropriate electronic instrumentation.

The high voltage electrode is cylindrical with a central bore coincident with the longitudinal axis. The electrode element is part of the bridge circuit and is of proper dimension to accommodate a wide range of cable dimensions. The shielded conductor is continuously passed through the electrode bore and high voltage is applied between the electrode and the cable conductor. The voltage is adjusted to the level required for corona discharge from a discontinuity of specified dimension in the conductor shield. The capacitance bridge, of which the high voltage electrode is one arm, filters out the 60 hz component of the voltage and supplies a signal to the detector circuit. This signal consists of plus or minus approximately 10 volt pulses with rise time determined by the filter. The detector circuit accepts the signal and provides a relay closure to indicate onset of corona discharge.

In this manner, when conductor shield skips and protrusions pass through the high voltage electrode, they are detected and may be marked by manual or automatic means or identified by recording their measured locations. The invention can be implemented using either an AC or DC power supply for maintaining electrode potential.

Thus, it is an object of the present invention to provide an apparatus and a method for continuously testing high voltage cable conductor shield for skips and protrusions during cable manufacture.

Another object of the present invention is to provide an apparatus and a method for continuously identifying protrusions at the high voltage cable conductor shield-insulation interface.

Yet another object of the present invention is to provide an apparatus and method for continuously identifying skips in the high voltage conductor shield.

Still another object of the present invention is to provide a dynamic apparatus and a flexible method for continuously detecting skips, protrusions and other shield defects in various conductor sizes.

Yet another object of this invention is to provide an apparatus for continuously testing high voltage cable conductor which is designed for long service life, since no portion thereof contacts the advancing shielded conductor.

DETAILED DESCRIPTION OF A PREFERRED EMBODIMENT

Figure 1:
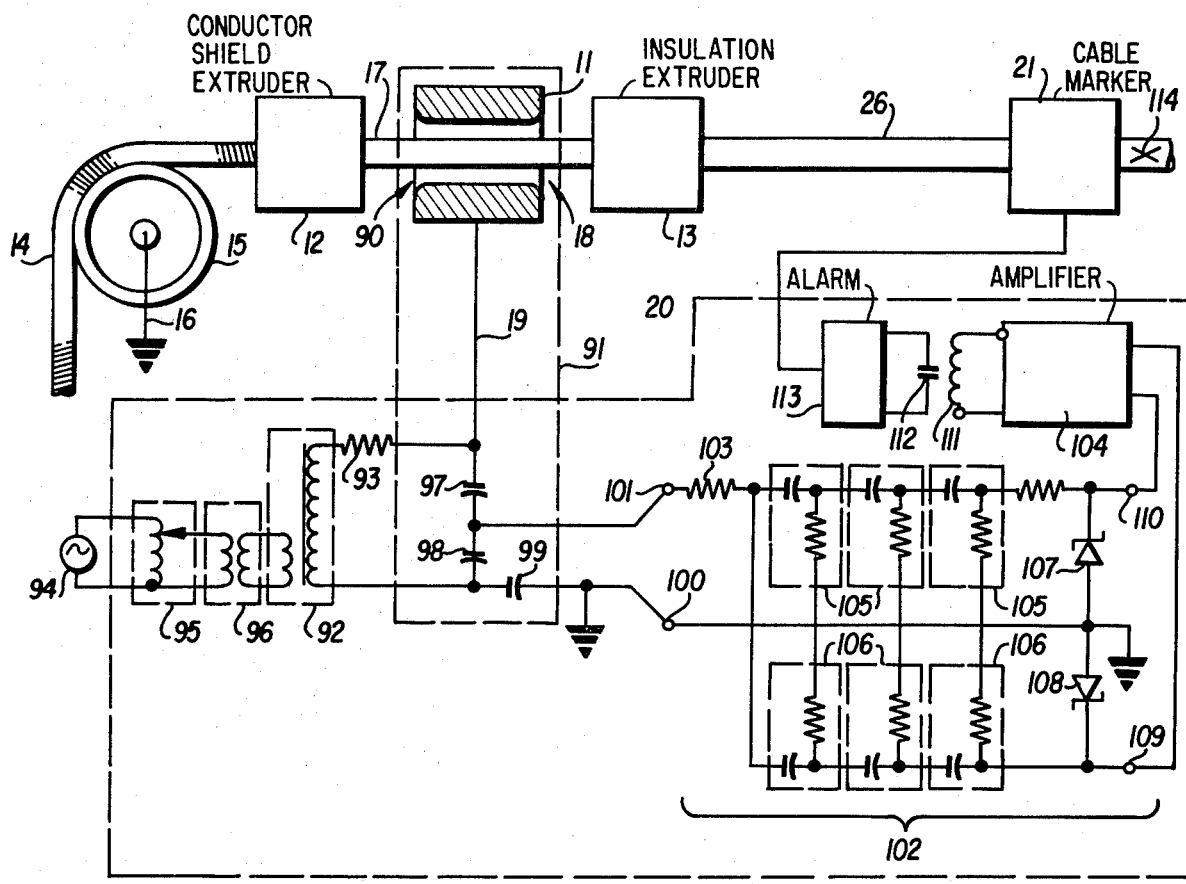
FIG. 1 is a schematic of a preferred embodiment of apparatus for detection of cable shield skips and protrusions shown in place on a cable assembly line.

While the specification concludes with claims particularly pointing out and distinctly claiming the subject matter which is regarded as the invention, it is believed that the invention, objects, features and advantages thereof will be better understood from the following description taken in connection with the accompanied drawings in which like parts are given like identification numerals and wherein:

FIG. 1 illustrates part of a typical shielded cable assembly line with a coaxial high voltage electrode 11 located between the conductor shield extruder 12 and the insulation extruder 13. The cable conductors 14 are continuously drawn over a pulley 15 for feeding into the conductor shield extruder 12. A ground wire 16 is connected from the metallic pulley 15 to ground to establish an electrical path from the cable conductors 14 to ground. Other electrical paths are possible, such as through the conductor shield extruder 12 to ground, or through the use of grounded wiper fingers (not shown) which may be dragged across the conductors. The electrical resistance of this electrical path should be relatively low.

The shielded conductor 17 then continuously enters the hollow cylindrical electrode 11 to which a constant amplitude alternating (AC) voltage with respect to the grounded cable conductors 14 is applied. The electrode 11 is mechanically positioned such that it is concentric with the cable under test as explaind hereinafter. The magnitude of the electrode voltage is adjusted to a value such that the electric field intensity existing in the cylindrical air gap 18, between the shielded cable 17 and the inner cylindrical surface of the electrode 11, approaches, but is less than, the electrical breakdown value for the air in the gap. The electrical breakdown value for air is a function of barometric pressure, relative humidity (for values up to approximately 90% relative humidity) and temperature. These factors may be taken into account in adjusting the magnitude of the electrode 11 voltage; however, excellent results can be obtained for locations where the humidity and temperature are relatively constant without correction for these factors. The calibration of the voltage is done with a shielded conductor 17 of smooth surface and proper size in place or with a cylindrical metallic rod (not shown) in place. The outer surface of such rod should be smooth, of the proper diameter, cylindrical in shape and concentric with the electrode 11 inner surface.

While this apparatus is implemented with an AC supply, the voltage for establishing the required voltage gradient or electric field similar in strength and distribution to that encountered by finished cable to accurately define points of high voltage stress can be either DC or AC. The resultant electrode current consists of three components: (1) leakage current; (2) capacitive current, (a) steady state (AC excitation only), (b) capacitive variations (cable position variations); and (3) corona current. The corona current consists of high frequency discharges whereas the other current components are at low frequencies. Filtered corona current is measured to detect skips and protrusions.

The high voltage lead 19 connects the high voltage electrode 11 to the control unit 20. The output of the control unit 20 may be connected to a recording device or cable marking unit 21 which may also have an input from a cable position sensor (not shown) such that the detector output signal can be correlated to position along the cable. After passing through the high voltage electrode 11 the shielded conductor 17 enters the insulation extruder 13. The insulated cable 26 then passes through the remainder of the cable assembly process.

Figure 2:
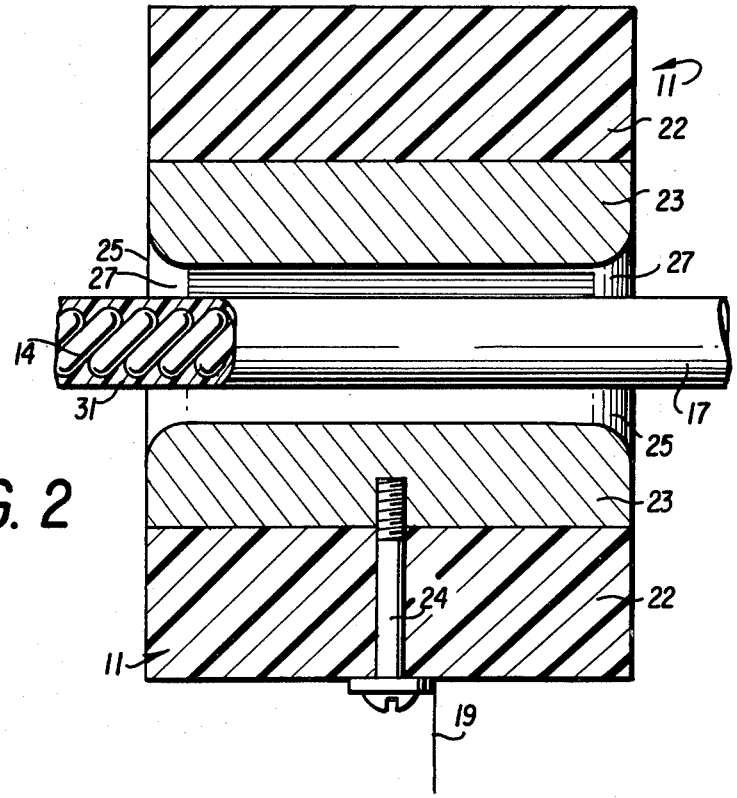
FIG. 2 is a cross-sectional side view of a preferred embodiment of a high voltage cylindrical electrode, surrounding but not touching the unfinished shielded conductor cable.

FIG. 2 shows the shielded conductor 17 located within the coaxial high voltage electrode 11. The high voltage electrode 11 is composed of an inner electrically conducting material 23 and an outer electrically insulating material 22, which are assembled in such a manner that they define a central aperture or path for a shielded conductor 17 along the longitudinal axis of said electrode 11. An electrically conducting screw 24 is used to hold the inner conducting portion 23 in place within the insulating portion 22 and to provide an electrical path between the inner conducting portion 23 and the high voltage lead 19.

The inner surface of the inner conducting portion 23 of the high voltage electrode 11 should be smooth and cylindrical in shape. Rounded edges 25 of the inner conductor 23 at the entrance and exit ports 27 are needed to provide a smooth transition between the high electric field strength region within the electrode cavity and the low field strength region exterior to the electrode 11 cavity. In particular, the radius of curvature of the inner electrode conductor 23 is preferably selected such that the electric field strength in the regions at the entrance and exit ports 27 of the electrode 11 are less than the electric field strength existing within the electrode 11 cavity between the inner surface of the electrode 23 and the shielded conductor 17.

Figure 3:
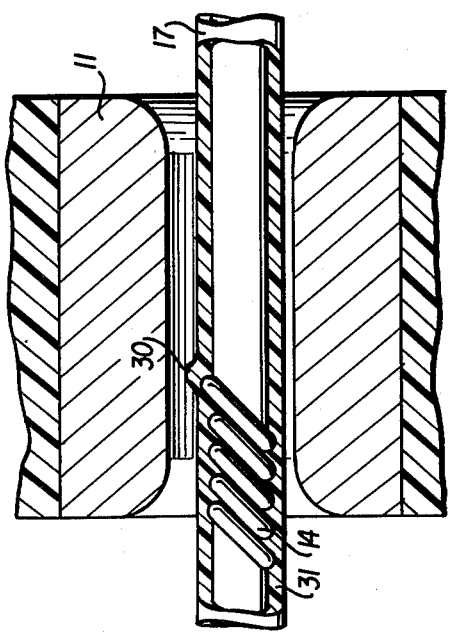
FIG. 3 is a side view of the shielded conductor passing through the high voltage electrode with a protruding imperfection in the conductor shield.

FIG. 3 shows a protruding imperfection 30 in the conductor shield 31 of a shielded conductor 17 passing through the high voltage electrode 11. Such a protrusion 30 causes an increase in the electric field strength in the region of the protrusion 30. If the increase in the electric field strength is sufficiently high, it may reach the breakdown level of air causing an electric discharge to occur. This discharge current is then detected and recorded indicating an imperfection in the shielded conductor 17. The increase in electric field strength is related to the shape (radius of curvature) of the protrusion 30 and the decrease in distance between the outer surface of the conductor shield 31 and the inner surface of the high voltage electrode 11. The shape of the imperfection 30 is more significant than the decrease in distance for normal production environments and tolerances. As an example of the increase in field strength, a hemispherical protrusion 30 with a small radius will cause an increase of approximately 300% in the electric field strength immediately above the crest of the hemisphere. The increase in field strength resulting from decreasing the distance between the outer surface of the conductor shield 31 and the inner surface of the electrode 11, where such nominal distance may typically be greater than one quarter of an inch is negligible compared to the 300% increase due to the hemispherical shape. Shapes which are sharper than hemispherical will produce greater increases than that for the hemisphere.

Figure 4:
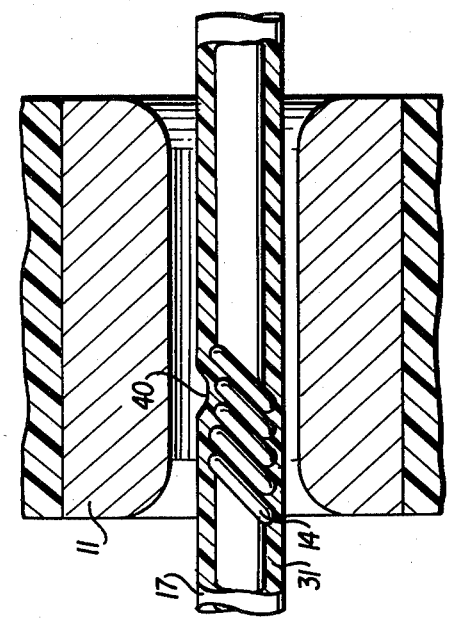
FIG. 4 is a view similar to FIG. 3 illustrating a skip imperfection in the conductor shield.

FIG. 4 shows a shielded conductor 17 passing through the electrode 11 where the conductor shield 31 has a skip 40 or small local missing section. Electric field increase will result from this imperfection due to the discontinuity at the edges of the skip 40.

Figure 5:
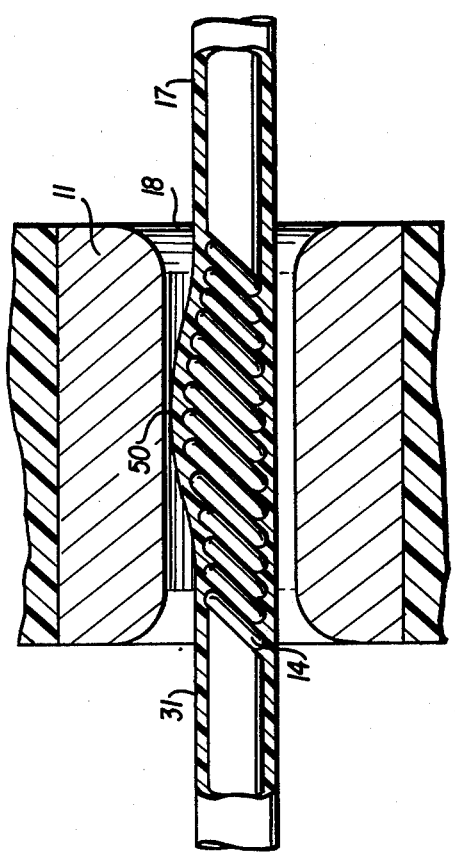
FIG. 5 is a view similar to FIG. 3 depicting a large bulge in the shielded conductor.

FIG. 5 shows a shielded conductor 17 passing through the electrode 11 where a large increase in cable radius is present. Although no sharp curvatures are present to increase the electric field strength, bulge 50 will cause a significant decrease in the distance between the outer surface of the cable shield 31 and the inner surface of the electrode 11 resulting in electric field increase and subsequent breakdown of the air in the surrounding air gap 18.

Figure 6:
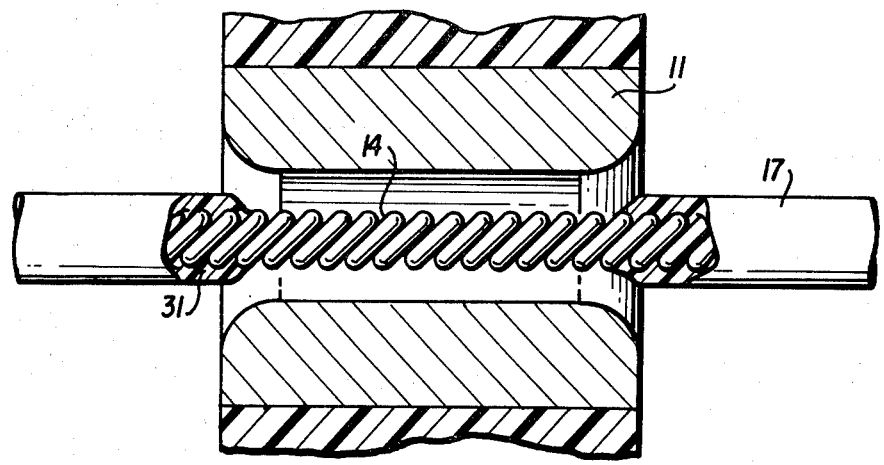
FIG. 6 is a view similar to FIG. 3 showing a large section missing from the conductor shield.

FIG. 6 shows a shielded conductor 17 passing through the high voltage electrode 11 where a significant portion of the shield 31 is absent. In this case, the electric field intensity will decrease due to the increase in the separation between the cable 17 and the electrode 11, but more significantly the curvature of the exposed conductor 14 is substantially greater than the curvature of the overall shielded conductor and thus significant increase of field strength will occur at the surface of the cable conductor 14, resulting in air breakdown.

Figure 7:
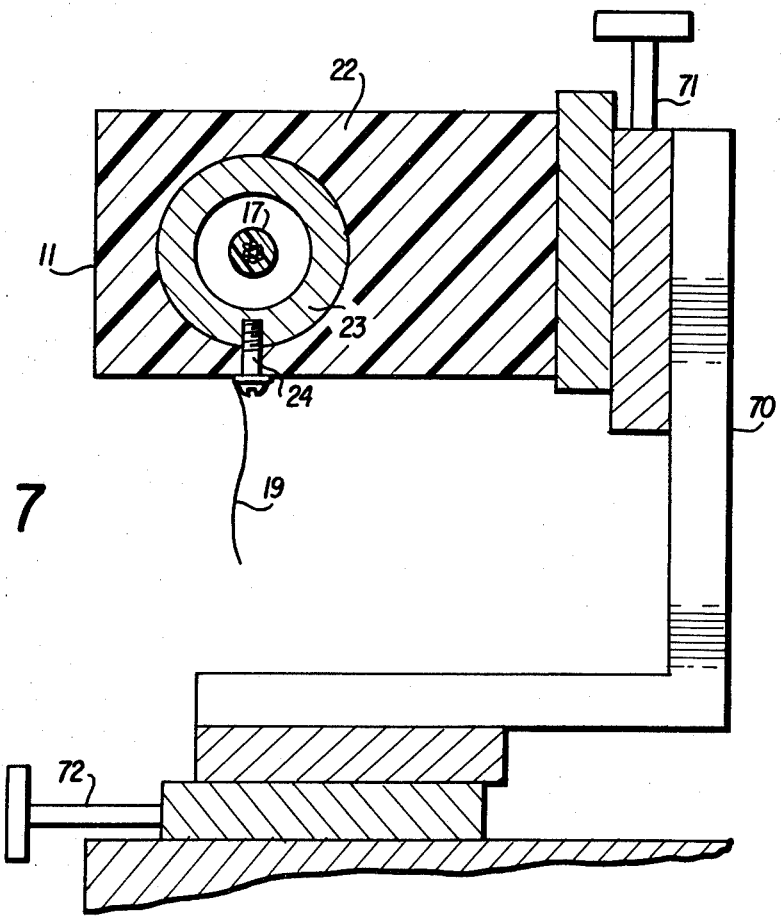
FIG. 7 is a cross-sectional end view of a two axis mechanical positioner for positioning the high voltage electrode concentrically with the unfinished cable under test.

FIG. 7 shows a two dimensional positioning apparatus 70 for positioning electrode 11 concentrically with the shielded conductor 17. Linear slide positioners 71 and 72 move the electrode 11 in the vertical and horizontal planes respectively. Telescopes (not shown) may be employed as sight aids to center the electrode 11 to a high degree of precision. The shielded conductor 17 is preferably centered to an accuracy of 1% of the radial distance between the outer surface of the strand shield 31 and the inner surface of the electrode 23.

Referring again to FIG. 1, the high voltage electrode capacitance forms one leg 90 of a capacitance bridge 91. A high voltage transformer 92 supplies the capacitance bridge 91 through a large resistor 93. The minimum preferred rating of the high voltage transformer should be 100 VA and the voltage rating approximately 20% higher than the maximum anticipated operating voltage. The preferred rating will guarantee a sinusoidal high voltage output. The high voltage transformer 92 is supplied from a conventional 110 V AC source 94 via a variable transformer 95, and an isolation transformer 96. This configuration effects voltage control and also isolates the high voltage transformer 92 from the utility ground. The ratings of the variable transformer 95 and the isolation transformer 96 should be compatible with the ratings of the high voltage transformer 92. The large resistor 93 is preferably selected such that the voltage of the high voltage transformer 92 is distributed approximately 50% to the high voltage capacitance leg 90 and approximately 50% to the large resistor 93.

The capacitor 97 of the capacitance bridge 91 is of low capacitance, with a high voltage rating. Preferred ratings are 100 pf and AC voltage rating equal or higher than the high voltage side rating of the high voltage transformer 92. The preferred capacitance of the capacitor 98 is 100 times the capacitance of capacitor 97 and its voltage rating at least 0.01 times the voltage rating of capacitor 97. The preferred capacitance of capacitor 99 is 500 pf to 1000 pf and the AC voltage rating approximately equal to the rating of the high side of the high voltage transformer 92. One side of capacitor 99 is connected to ground. Conductor 14 is also connected to the same ground.

The capacitance bridge 91 is supplied from an almost sinusoidal, high impedance voltage source. The capacitance bridge 91 itself is so selected that the applied voltage is mostly consumed at the capacitance of the high voltage electrode 11 in one leg and at the capacitor 97 at the other leg. Approximately one hundredth of the applied voltage is consumed at the capacitors 99 and 98 of the two bridge legs respectively. An electric discharge between the outer surface of the cable shield 31 of shielded conductor 17 and the inner surface of the high voltage electrode 11 will almost instantaneously generate additional potential difference between the terminals 100 and 101 of the capacitance bridge 91 which will be proportional to the electric charge transferred. The aforementioned additional potential difference between the terminals 100 and 101 is the corona signal from which the defect signal is derived.

The capacitance bridge 91 need not be balanced since the corona signal may be mixed with a power frequency sinusoidal voltage. The corona signal is separated and conditioned with the filter/separator 102 of FIG. 1.

In the preferred embodiment of the filter/separator 102 of FIG. 1, the resistor 103 is so selected as to retard the rise time of the corona signal to approximately 0.1 to 0.3 microseconds. This feature enhances performance of the amplifier 104. The corona signal is fed into two common ground cascaded RC filters 105 and 106. A zener diode 107 at the output of filter 105 blocks the negative signals and a zener diode 108 at the output of filter 106 blocks the positive signals. Thus, at outputs 109 and 110 of the filter/separator 102 a defect signal of specified polarity appears. The preferred break frequency of the RC filters 105 and 106 is in the order of 100 times the power frequency, and the preferred ratings of the zener diodes 107 and 108 are 5 to 10 volts and (1) ampere.

The amplifier 104 of FIG. 1 has the following features. Whenever the voltage across outputs 109 and 110 (defect signal) surpasses a specified threshold value (for example 1 volt), the amplifier 104 drives the relay 111 for a specified preferred time duration (0.2 sec. to 1 sec.). The contact 112 of the relay 111 closes and activates an alarm 113 and a recorder or cable marker mechanism 21. The alarm mechanism can be simply an audio or visual display indicator. The marking device or recorder 21 locates the detected fault 114 for later identification.

While the invention has been illustrated and described as embodied in an arrangement for skip and protrusion detection, it is not intended to be limited to the details shown, since various modifications and structural or electrical changes may be made without departing in any way from the spirit and scope of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic of specific aspects of this invention and, therefore, such adaptations should and are intended to be comprehended within the meaning and scope of equivalence of the following claims.

What we claim as the invention is:

1. Apparatus for detecting defects in a semi-conductive conductor shield of unfinished high voltage cable which is continuously advanced along a path of travel, comprising:

means, including a high voltage electrode arranged in non-contacting relation around said continuously advancing cable, for applying high voltage power concentrically around said continuously advancing cable to produce an electric field around said cable, the magnitude of said high voltage power being selected such that the electric field intensity existing in the air gap between the shielded cable and the inner cylindrical surface of the electrode approaches, but is less than, the electrical breakdown value for the air in the gap;

means connected to said means for applying high voltage power for detecting the resultant electrode current having a corona discharge component caused by field strength changes in said electric field resulting from defects in said conductor shield;

means connected to the detecting means for filtering said resultant electrode current to eliminate any low frequency components thereof and produce a corona current signal corresponding to said corona discharge component;

means arranged downstream of said means for applying high voltage power for applying insulation about said unfinished high voltage cable; and means connected to the means for filtering said resultant electrode current for indicating the presence of at least one of a skip, protrusion, protuberance and other defect in said conductor shield upon receiving said corona current signal.

2. Apparatus according to claim 1, wherein said high voltage power applying means further comprises:

means for supplying a high voltage to said electrode.

3. Apparatus according to claim 1, including means for converting said corona current signal into an alarm signal.

4. Apparatus according to claim 1, including means responsive to said corona current signal for identifying the location of said defects.

5. Apparatus according to claim 1, including means for connecting the conductor strand of the continuously advancing cable to ground.

6. The apparatus of claim 2 wherein said high voltage electrode further comprises position adjustment means for aligning said high voltage electrode concentrically with the longitudinal axis of said shielded conductor.

7. The apparatus of claim 2 wherein said means for supplying high voltage to said electrode is an AC supply.

8. The apparatus of claim 2 wherein said means for supplying high voltage to said electrode is a DC supply.

9. The apparatus of claim 5 wherein said means for connecting the conductor to ground comprises a grounded metallic pulley arranged to continuously contact portions of said conductor.

10. The apparatus of claim 2 wherein said high voltage electrode further comprises an inner electrically conducting component, an outer electrically insulating component, and means for holding said inner electrically conducting component in place, said holding means providing an electrical path between said inner electrically conducting component and said means for supplying high voltage.

11. The apparatus of claim 10 wherein said inner electrically conducting component further comprises a cylinder having a smooth inner surface forming a cavity with rounded entrance and exits ports adapted to provide a smooth transition from high electric field strength within the cavity of said inner component to low electric field strength outside the cavity of said inner component, thereby providing a graded reduction of field strength to promote accurate detection of conductor shield defects.

12. The apparatus of claim 2 wherein said means for supplying high voltage power further comprises:

a high voltage transformer with a power rating of at least 100 volt amps and a voltage rating approximately 20 percent higher than the maximum anticipated operating voltage;

an isolation transformer, compatible in rating with said high voltage transformer, for transmitting power to said high voltage transformer;

a variable transformer compatible in rating with said high voltage transformer, for transmitting power to said isolation transformer;

a power source for supplying power to said variable transformer; and means for transmitting power to said detection means comprising a resistor adapted to consume approximately 50 percent of the high voltage supplied by said high voltage transformer.

13. The apparatus of claim 12 wherein said detection means includes a capacitance bridge comprising:

a high voltage electrode capacitance leg;

a first capacitor with a capacitance of 100 pico Farads and an AC voltage rating equal to or higher than the high voltage side rating of said high voltage transformer;

a second capacitor with a capacitance of about 100 times the capacitance of said first capacitor and an AC voltage rating at least 0.01 times the voltage rating of said first capacitor; and a third capacitor with a capacitance in the range of 500 pico Farads to 1000 pico Farads and having an AC voltage rating approximately equal to the rating of the high side of said high voltage transformer, one side of said third capacitor and said conductor being connected to a common ground.

14. The apparatus of claim 1, wherein said means for filtering said resultant electrode current comprises a resistor adapted to retard the rise time of said resultant electrode current to approximately 0.1 to 0.3 microseconds; and said means for filtering further comprises a pair of common ground cascaded RC filter means for filtering said resultant electrode current comprising a multiplicity of RC filters with preferred break frequency approximately 100 times the power frequency, a first zener diode connected to the output of one of said cascaded RC filter means and adapted to block negative signals, and a second zener diode connected to the output of the other of said cascaded RC filter means and adapted to block positive signals, thereby producing said corona current signal.

15. The apparatus of claim 3, wherein said means for converting said corona current signal into an alarm signal comprises:
amplifier means for receiving said corona current signal whenever the signal voltage surpasses a predetermined threshold value and for transmitting a drive signal for a predetermined time duration; and
a relay connected to the amplifier means for receiving said drive signal, said relay comprising contacts which close when driven by said drive signal and activate an alarm means.

16. An apparatus of claim 4 wherein said means for identifying detected defects comprises marking means for continuously marking the location of detected defects on the cable for later identification.

17. A method of detecting defects in the semi-conductive conductor shield of unfinished high voltage cable which is continuously advanced along a path of travel, comprising the steps of:
applying high voltage power concentrically around said continuously advancing cable utilizing a high voltage electrode arranged in non-contacting relation around said continuously advancing cable to produce an electric field around said cable, the magnitude of said high voltage power being selected such that the electric field intensity existing in the air gap between the shielded cable and the inner cylindrical surface of the electrode approaches, but is less than, the electrical breakdown value for the air in the gap;
detecting the resultant electrode current having a corona discharge component caused by field strength changes in said electric field resulting from defects in said conductor shield;
filtering said resultant electrode current to eliminate any low frequency components thereof and produce a corona current signal corresponding to said corona discharge component;
applying insulation about said unfinished high voltage cable subsequent to detecting changes in said electric field; and
indicating the presence of at least one of a skip, protrusion, protuberance and other defect in said conductor shield in correspondence with said corona current signal.

18. Method according to claim 17, including the step of converting said corona current signal into an alarm signal.

19. Method according to claim 17, including the step of identifying the location of said defects in response to said corona current signal.

* * * * *